US006486554B2

(12) United States Patent
Johnson

(10) Patent No.: US 6,486,554 B2
(45) Date of Patent: Nov. 26, 2002

(54) MOLDED BODY FOR PBGA AND CHIP-SCALE PACKAGES

(75) Inventor: Eric Arthur Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 09/822,024

(22) Filed: Mar. 30, 2001

(65) Prior Publication Data

US 2002/0140108 A1 Oct. 3, 2002

(51) Int. Cl.[7] .................... H05K 7/20; H01L 23/48; H01L 23/28
(52) U.S. Cl. .................. 257/738; 257/737; 257/778; 257/774; 257/712; 257/704; 257/710; 257/698; 257/696; 257/706; 257/707; 257/726; 257/718; 257/719; 257/675; 257/720; 257/787; 361/717; 361/688
(58) Field of Search ................ 257/738, 737, 257/734, 778, 787, 712, 713, 718, 719, 720, 704, 710, 675, 676, 692, 697, 698, 7.6, 7.7, 726; 361/717, 688, 704, 705, 706, 713, 718, 719

(56) References Cited

U.S. PATENT DOCUMENTS

| 5,203,076 | A | | 4/1993 | Banerji et al. |
| 5,218,234 | A | | 6/1993 | Thompson ................ 257/787 |
| 5,679,978 | A | * | 10/1997 | Kawahara et al. .......... 257/787 |
| 5,726,079 | A | | 3/1998 | Johnson |
| 5,817,545 | A | | 10/1998 | Wang et al. |
| 5,864,178 | A | | 1/1999 | Yamada et al. |
| 5,883,430 | A | | 3/1999 | Johnson |
| 5,998,243 | A | | 12/1999 | Odashima et al. |
| 5,998,861 | A | | 12/1999 | Hiruta |
| 6,023,096 | A | * | 2/2000 | Hotta et al. ................ 257/787 |
| 6,104,093 | A | * | 8/2000 | Caletka et al. ............. 257/778 |
| 6,127,724 | A | * | 10/2000 | DiStefano .................. 257/675 |
| 6,208,519 | B1 | * | 3/2001 | Jiang et al. ................. 257/706 |
| 6,218,731 | B1 | * | 4/2001 | Huang et al. ............... 257/738 |
| 6,246,115 | B1 | * | 6/2001 | Tang et al. ................. 257/706 |
| 6,265,771 | B1 | * | 7/2001 | Ference et al. ............ 257/706 |
| 6,288,900 | B1 | * | 9/2001 | Johnson et al. ............ 257/713 |
| 6,323,066 | B2 | * | 11/2001 | Lai et al. ................... 438/122 |
| 6,339,254 | B1 | * | 1/2002 | Venkateshwaran et al. . 257/737 |

FOREIGN PATENT DOCUMENTS

| JP | 1-201941 | * | 8/1989 | ................ 257/678 |
| JP | 1-244652 | * | 9/1989 | ................ 257/706 |

* cited by examiner

Primary Examiner—Alexander O. Williams

(57) ABSTRACT

An electronic package which has a thermally conductive member encapsulated with the semiconductor chip; and which is adapted for chip-scale or near-chip-scale applications of both wire-bond and flip-chip packages. For adhesively bonding the semiconductor chip to a circuitized carrier or substrate on which the chip is positioned, and to concurrently form an encapsulating structure protecting the semiconductor chip, there is provided a mold compound, such as a thermosetting plastic resin or epoxy to not only extend between the surface of the circuitized substrate or carrier facing the semiconductor chip, and possibly about the peripheral sides of the carrier, but to also at least extend over and encompass the peripheral edge portions of the opposite surface of the carrier or circuitized substrate distal to or facing away from the chip.

18 Claims, 2 Drawing Sheets

MOLDED BODY FOR PBGA AND CHIP-SCALE PACKAGES

BACKGROUND OF THE INVENTION

1. Field of the Invention

The present invention relates in general to electronic packages and methods of forming thereof, and in particular pertains to an electronic package which has a thermally conductive member encapsulated with the semiconductor chip; and which is adapted for chip-scale or near-chip-scale applications of both wire-bond and flip-chip packages.

In essence, a particular type of electronic package which consists of a PBGA (plastic ball grid array) package, and which is applicable to chip-scale or near-chip-scale applications, and is essentially constituted of a chip mounted on an organic, wire carrier or circuitized substrate the size of which may extend beyond the peripheral dimensions of the semiconductor chip. The foregoing relates to both wire-bond and flip chip packages and wherein in order to protect the semiconductor chip from the deleterious or debilitating effects of the environment, it is generally desirable to form an insulating body about the chip, this body generally being in the form of a molded epoxy material forming an encapsulant. Generally, as is well known in the technology, interfacial stresses which are generated between the encapsulating molded material, such as the epoxy which may be a thermoset plastic resin, and the circuitized substrate or chip carrier, can be quite considerable in magnitude and may result in delamination of the components as a result of exposure to moisture or during thermal cycling. This will adversely affect the reliability and possibly even completely destroy the electrical interconnections of the electronic package and the functional integrity thereof, leading to potentially extensive financial and economic losses. Heretofore, when applying the molded material producing the protective structure encompassing the semiconductor chip and forming the physical bond with the carrier or circuitized substrate on which the chip is positioned, the molded material has been confined to engagement with the surface on the side of the carrier or substrate on which the semiconductor chip is mounted, whereby the opposite or distal side of the carrier, on which there is normally disposed an array of solder balls (BGA's) is left unencapsulated so as to provide electrical connecting access for the solder balls. Although the encapsulation of the semiconductor chip and the resulting bonding with the circuitized substrate or carrier is effected by a molded compound generally constituted of an epoxy, the tendency in industry, at this time has been a shifting towards the use of mold compounds or bodies forming the encapsulate for the electronic package which has a lower coefficient of thermal expansion (CTE) than heretofore, whereby the interfacial stresses which extend normal to the surface of the carrier or circuitized substrate facing towards the semiconductor chip are reduced in the region extending about the periphery of the semiconductor chip. This, in essence, increases the bending of the electronic semiconductor chip-mounting package and decreases the fatigue life expectancy of the ball grid arrays (BGA). Although the stresses which are generated as a result of bending are ordinarily not a problem to the degree in chip-scale packages as they would be in larger PBGA's, these stresses must be still minimized due to the effect on BGA fatigue and to enable an increase in their length of service life. The fatigue life of such BGA's represents a particular problem for chip-scale packages, inasmuch as the solder ball size and the pitch between balls must be decreased in order to be able to provide sufficient numbers of interconnections with the small package size, whereby both of these decreases in pitch and size result in a shorter fatigue life for the structure.

Although the prior art has addressed itself to this problem by providing various improved bonding interconnections between the mold compound or material encapsulating a semiconductor chip and by also concurrently encapsulating the surface and, as required, potentially the peripheral side surfaces of the carrier or circuitized substrate, problems are still encountered in providing an adequate degree of adhesion between the components which will prevent delamination under conditions of bending or thermal cycling This problem has been addressed to some extent in co-pending U.S. patent application Ser. No. 09/430,075, (Attorneys Docket EN998109), in which there are disclosed various embodiments directed to the encapsulation of semiconductor chips or electronic packages with a mold material, such as a thermoset plastic or molded epoxy resin, and wherein the encapsultaing material also encompasses the periphery of the chip-mounting substrate or circuitized carrier and the surface thereof which faces towards the mounted semiconductor chip.

2. Discussion of the Prior Art

A number of publications are disclosed in the technology which concern themselves with the use of an encapsulating material extending about and bonding semiconductor chips to diverse kinds of circuitized substrates or carriers.

Thus, Hiruta U.S. Pat. No. 5,998,861 discloses a semiconductor device with a ball grid array (BGA) wherein an epoxy material provides an encapsulant between a semiconductor chip and the facing surface of a carrier for the ball grid array.

Odashima, et al. U.S. Pat. No. 5,998,243 discloses a method for the manufacturing of semiconductor devices and an apparatus, whereby a resin material forms an encapsulate between a semiconductor chip and a carrier on which the chip is mounted.

Yamada, et al. U.S. Pat. No. 5,864,178 discloses a semiconductor device with an encapsulating material constituting of a curable resin for bonding a flip-chip bonded semiconductor chip to the facing surface structure of a substrate or circuitized carrier body mounting the chip.

Other publications which concern themselves to some extent with various encapsulating materials adapted to be employed in electronic packages are Wang et al., U.S. Pat. No. 5,817,545; Thompson et al., U.S. Pat. No. 5,218,234, and Banerji et al., U.S. Pat. No. 5,203,076.

Although the foregoing publications each deal in different measures or degrees with various aspects in providing apparatus and methods for encapsulating semiconductor chips in order to protect the components of the electronic package against potentially deleterious environmental influences, and by utilizing various suitable encapsulating resins or thermosetting plastic materials, such as molded epoxy compounds or silicones, all of these publications limit the encapsulating interconnections or bonding between the circuitized semiconductor chip and the carrier or substrate in that the adhesion or bonding is only effected between the semiconductor chip and the surface of the substrate facing towards the superimposed semiconductor chip, and, at times as required, extending about the peripheral sides or edges of the substrate.

SUMMARY OF THE INVENTION

Accordingly, in order to significantly improve upon the foregoing methods and structure for adhesively bonding the semiconductor chip to a circuitized carrier or substrate on which the chip is positioned, and to concurrently form an encapsulating structure protecting the semiconductor chip, the present invention provides for a mold compound, such as a thermosetting plastic resin or epoxy to not only extend between the surface of the circuitized substrate or carrier facing the semiconductor chip, and possibly about the peripheral sides of the carrier, but to also at least extend over and encompass the peripheral edge portions of the opposite surface of the carrier or circuitized substrate distal to or facing away from the chip, which will counteract any tendency towards delamination between the components of the electronic package, in effect, between the semiconductor chip and the circuitized substrate or carrier; and considerably reduce stresses and strains so as to preserve the reliability of the electronic package.

In particular, in the utilization of transfer molding when encapsulating a semiconductor chip in an electronic package, such as a PBGA package, heretofore the mold material has been confined to the side of the carrier or substrate on which the chip is mounted, with the opposite or distal side of the carrier on which there is disposed an array of solder balls (BGA) being left exposed and unencapsulated.

In contrast with the foregoing, pursuant to the present invention, the encapsulant, such as a thermoset plastic or molded epoxy, is extended about the peripheral sides of the substrate or circuitized carrier so as to contact and sealingly cover at least the lower edge surface portions of the carrier, preferably a portion of the surface mounting the BGA and perimetrically surrounding the latter. This, as a result, will considerably reduce the generating and intensity of any interfacial stresses on the chip-side of the carrier so as to thereby increase the resistance to delamination during potential exposure to moisture, or due to the effects which are encountered as a result of thermal cycling.

Another feature which can be employed pursuant to the invention is the use of through-holes which are formed in the carrier so as to extend between the opposite surface thereof proximate its peripheral edges, beyond or outwardly the dimensional confines of the semiconductor chip, and wherein these through-holes in the substrate or carrier can also be filled by the encapsulating material, thereby further increasing the degree of adhesion thereof to the carrier. The carrier or substrate edges can also be of scalloped configurations in order to enhance the encapsulating and adhesion action by the encapsulating material, and thereby still further strengthening the interconnection or adhesive bonding between the semiconductor chip and the carrier, and resisting any tendency towards delamination between the components of the electronic package.

In view of the foregoing, inventive aspects, it is also possible that the structure of the electronic package in providing this type of a more comprehensive adhesive encapsulation, reduces the likelihood of delamination between the carrier and the mold compound, thereby enabling a material with a higher coefficient thermal expansion to be employed, whereby bending of the composite structure is reduced as the coefficient of thermal expansion (CTE) of the encapsulating material approaches that of the chip carrier or substrate, typically such as 17 ppm/° C.

Accordingly, it is an object of the present invention to provide a novel electronic package which is imparted an enhanced degree of interconnection or bonding between a semiconductor chip and a circutized substrate carrier on which the chip is mounted.

Another object of the present invention is to provide a novel encapsulating arrangement interconnecting a semiconductor chip and a circuitized or substrate or carrier on which the chip is mounted so as to increase the degree of adhesion between these components and to thereby reduce the possibility of delamination taking place therebetween.

A further object of the present invention is to provide an electronic package of the type described wherein an encapsulant, such as a thermosetting plastic, encompasses a semiconductor chip which is positioned on a circuitized substrate, and whereby at least portions of a surface of the substrate facing away from the semiconductor chip, and mounting BGA is encompassed by the encapsulating material so as to further enhance the strength of the package against bending and resulting strains causing delamination between the components of the package.

Another object resides in the provision of a method for forming the electronic package comprising the semiconductor chip and the circuitized substrate having the novel encapsulating structure as described herein.

BRIEF DESCRIPTION OF THE ACCOMPANYING DRAWINGS

Reference may now be made to the following detailed description of preferred embodiments of the invention, taken in conjunction with the accompanying drawings; in which.

DETAILED DESCRIPTION OF PREFERRED EMBODIMENTS

Figure 1:
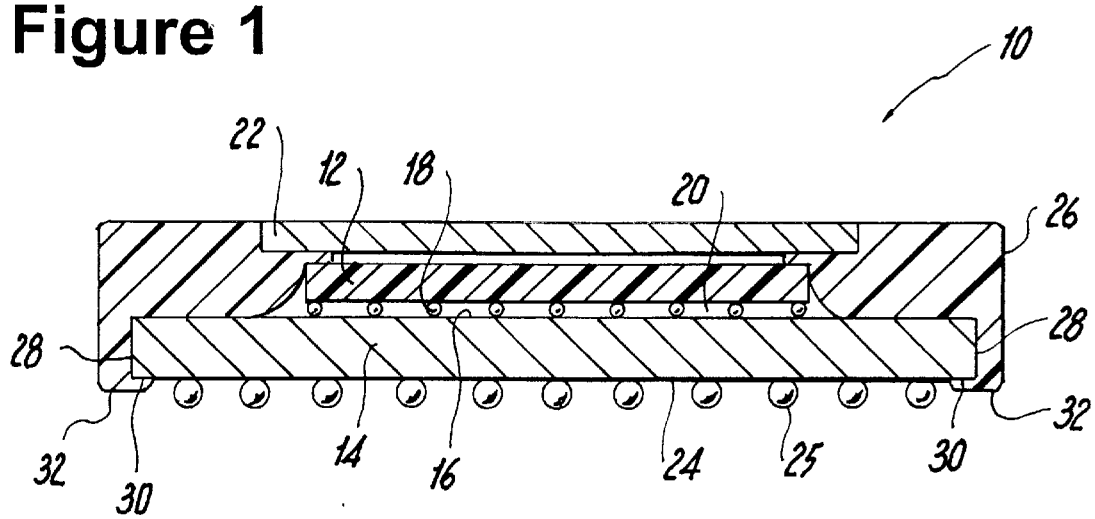
FIG. 1 illustrates, generally diagrammatically, a sectional view of a first embodiment of the electronic package of the invention, illustrating the assembled semiconductor chip, circuitized substrate and the thermally conductive encapsulant of the electronic package.

Referring in specific detail to the drawings, FIG. 1 illustrates in a transverse diagrammatic sectional representation electronic package 10 which includes a semiconductor chip or chip package 12 positioned above a circuitized substrate member 14, the latter of which is dimensioned so as to preferably extend beyond the peripheral dimensions of the semiconductor chip 12.

The surface 16 of the circuitized substrate member 14 facing towards the surface of the semiconductor chip 12 may have an array of solder balls 18 arranged in the spacing therebetween, and which solder balls are encapsulated in an underfill material 20, as is well known in the electronic packaging technology.

Arranged at the opposite side of the semiconductor chip 12 at a predetermined spacing therewith is a heat spreader 22, which may be in the form of a cap member constituted of a thermally conductive material so as to provide a heat sink, and wherein the peripheral dimensions of the heat spreader or cap 22 may extend beyond those of the semiconductor chip 12.

The surface 24 of the circuitized substrate member or carrier 14 which faces away from the semiconductor chip 12, may be provided with a plastic ball grid array (PBGA) 25, as is well known in the technology.

In order to provide an encapsulation of an environmentally protective nature with regard to the semiconductor chip 12, a molded adhesive compound 26 consisting of a dielectric material, such as a thermoset plastic or epoxy resin, is arranged so as to sealingly encompass the semiconductor chip, extend between the chip 12 and the heat spreader or cap 22, and to cover the surface 16 of the circuitized substrate member 14 facing the semiconductor chip, and at least the surfaces forming the peripheral sides 28 of the circutized substrate member 14.

In order to inventively enhance upon the degree of adhesion between components of the electronic package 10, such as the semiconductor chip 12 and the substrate member 14, the molded compound 26 of the dielectric material is extended so as to encompass at least the peripheral edge surface portions 28 and the lower surface regions 30 along the peripheral portion of the circuitized substrate member 14 opposite to or distal of the surface 16 on which the semiconductor chip 12 is mounted. This particular configuration of additional adhesive material 32 will further assist in enhancing the resistance to delamination between the components of the electronic package 10 comprising the semiconductor chip 12 and the circuitized substrate member 14 which ordinarily may tend to adversely affect the reliability in the functioning or potential failure of the electronic package 10 due to the ingress of moisture and possibly also due to the effects of thermal cycling.

Figure 2:
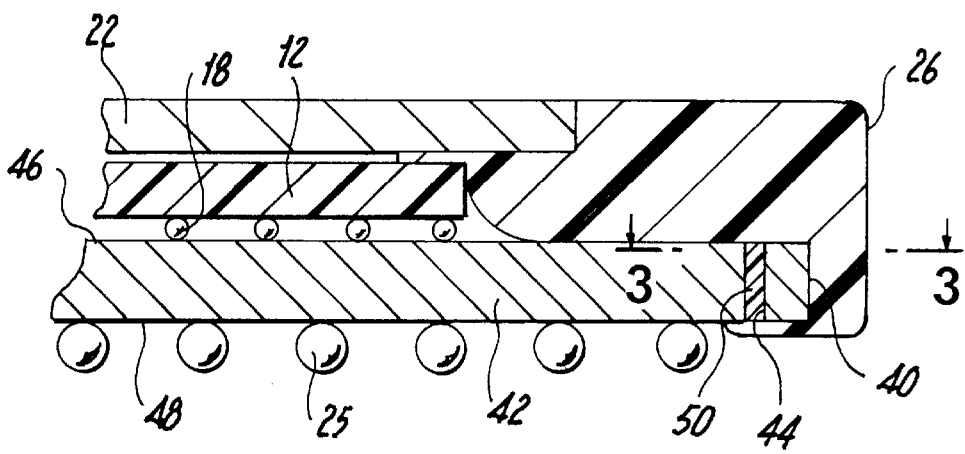
FIG. 2 illustrates a modified embodiment of an electronic package, represented in a view similar to FIG. 1, showing encapsulant-filled the through holes as formed in the circuitized substrate.
Figure 3:
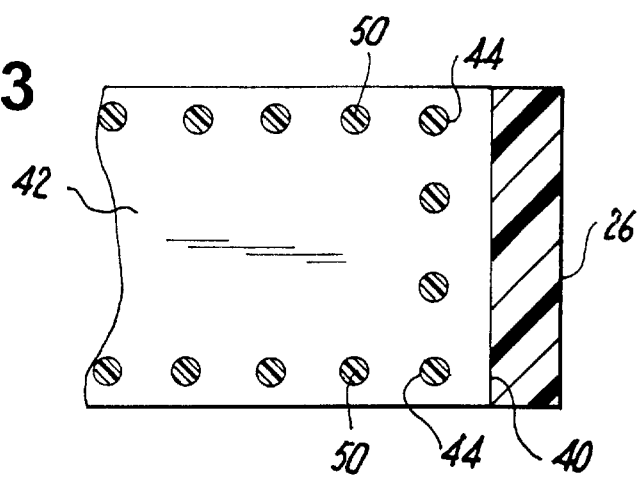
FIG. 3 illustrates a fragmentary sectional plan view taken along line 3—3 in FIG. 2.

Pursuant to a further embodiment of the invention as shown in FIGS. 2 and 3, in which elements identical to those in FIG. 1 have the same reference numerals, the peripheral edge regions 40 of the of the circuitized substrate member 42 may be provided with a plurality of spaced through-holes 44 extending between the opposite surfaces 46 and 48 of the circuitized substrate member. These holes 44 are each filled with additional encapsulating molded adhesive material 50, so as to still further increase the degree of adhesion between the semiconductor chip 12 and the circuitized substrate member 42, thereby resisting any tendencies towards delamination and enhancing the strength and reliability of the electronic package 10.

Figure 4:
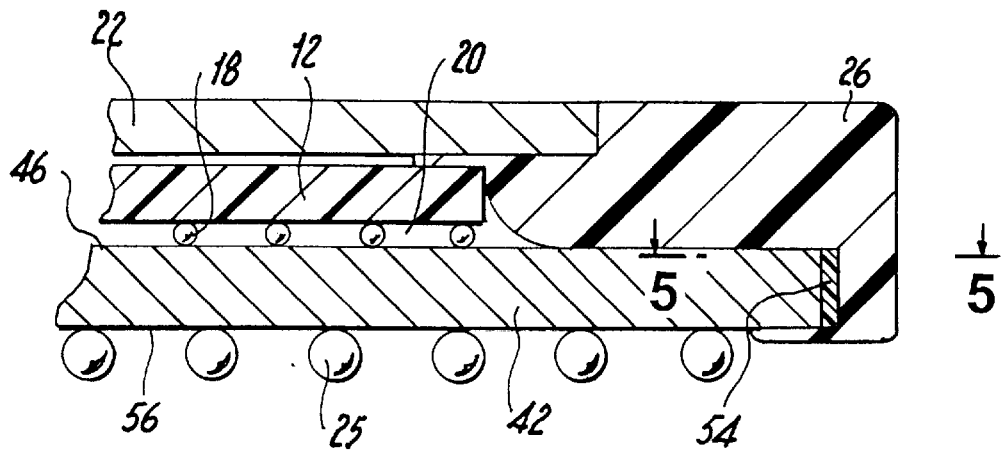
FIG. 4 illustrates another embodiment, represented in a view similar to FIG. 1, showing scallops formed in the peripheral edge region of the circuitized substrate.
Figure 5:
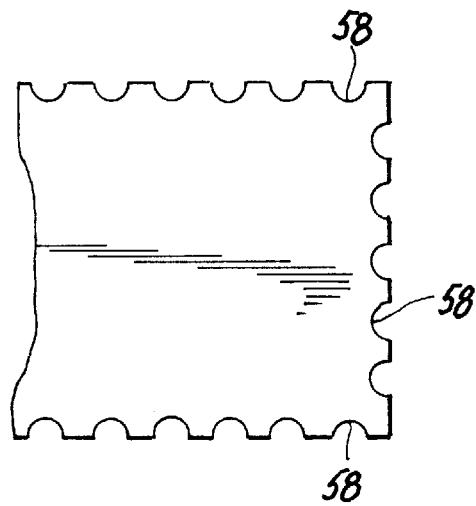
FIG. 5 illustrates a fragmentary sectional view taken along line 5—5 in FIG. 4, showing details of the scallops in the peripheral edge region of the substrate.

Alternatively, or possibly in addition to formation of the through-holes 44 in the substrate member, as shown in FIGS. 4 and 5, the peripheral edge surfaces or sides 54 of the circuitized substrate member 56 may be provided with spaced scallops or recesses 58 which, during the encapsulation of the electronic package 10 with the molded adhesive compound or epoxy resin 26 will fill the scallops or recesses, and further enhance the mechanical engagement between the package components.

Figure 6:
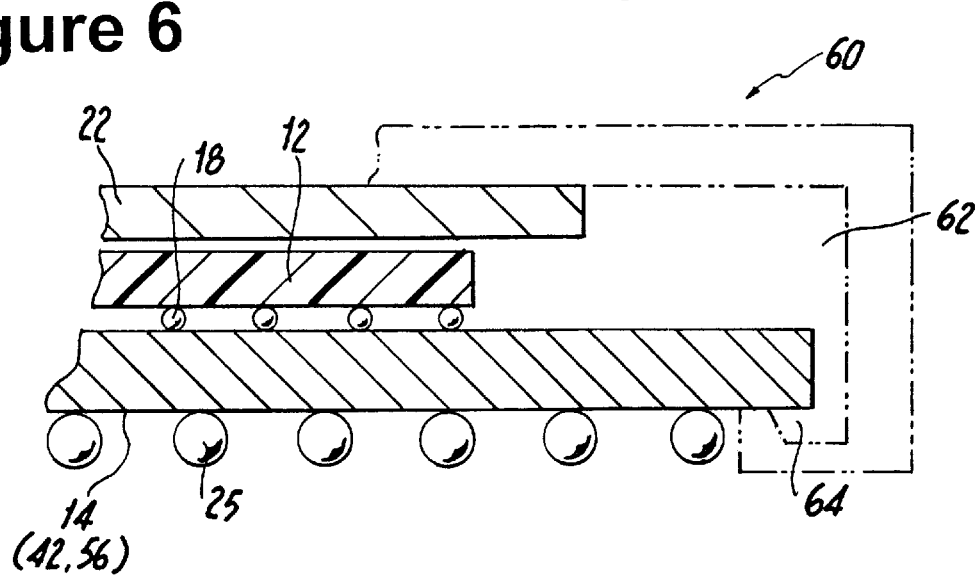
FIG. 6 illustrates, generally schematically, a mold utilized in producing the encapsulating structure for an the electronic package pursuant to the invention.

The foregoing construction and encapsulation of the components may be effected by a simple two-piece mold structure 60, as diagrammatically shown in FIG. 6, in which a cavity 62 in first segment thereof is slightly larger than the periphery of the substrate member or carrier, and whereby a second segment 64 of the mold structure supports the substrate member over a portion or large area of the surface opposite to or facing away from the semiconductor chip 12, so as to protect and seal off at least the region of the member carrying the BGA 25. This second segment seals this region thereby preventing the encapsulating adhesive material from covering the BGA area. Vents or a vacuum ensure that the unsupported region, peripherel to the BGA, is filled by mold compound.

In order to achieve a good adhesion between the components, only a thin covering of the encapsulating molded compound, possibly such as up to a thicknesses of 10 to 20 mils is necessary to be formed on the BGA side of the substrate member in order to achieve a good adhesion of the molded adhesive material. In that instance, the through-holes 44, as illustrated in FIGS. 2 and 3 of the drawings, or the scallops or recesses 58 formed about the periphery of the circuitized substrate members, enhance the adhesion of the encapsulating material to the circuitized substrate, and provide a mechanical interlocking between the molded material and the circuitized carrier or substrate member.

At times, the entire bottom surface of the carrier mounting the PBGA's, may be planar so as to be supported during molding, whereby the molded compound is only coplanar with the BGA surface and does not form any covering of the lower edge surface regions thereof. Inasmuch as filling of any through-holes 44 may be difficult in that instance, the edge scallops or recesses 58 formed in the carrier or substrate member will provide the necessary mechanical interlocking between the molded compound or encapsulate and the substrate member.

The foregoing clearly provides for a novel and advantageous manner in producing electronic packages of the type described which are highly resistant to any delamination caused by possible exposure to moisture and during thermal cycling, and which will provide a superior degree of adhesion between the encompassing encapsulant material, and the substrate member and the semiconductor chip.

While the invention has been particularly shown and described with respect to preferred embodiments thereof, it will be understood by those skilled in the art that the foregoing and other changes in form and details may be made therein without departing form the spirit and scope of the invention.

What is claimed is:

1. An electronic package, comprising:
   a substrate member having a plurality of electrical circuits arranged thereon;
   a semiconductor chip mounted on said substrate member in electrical communication with at least some of the electrical circuits on said substrate member, said semiconductor chip having a first planar surface spaced from a facing surface of said substrate member;
   a thermally conductive planar member having first and second opposite surfaces being arranged in thermally conductive communication with a second planar surface of said semiconductor chip distal from said substrate member;
   a substantially rigid dielectric material encapsulating said electronic package by sealingly extending about at least perimetrical edge surfaces of said thermally conductive member, said semiconductor chip, said substrate member and peripheral edge portions of the surface on said substrate member distal from the surface facing and mounting said semiconductor chip; and
   a plurality of through-holes being formed in said substrate member extending between the opposite surfaces thereof, said through-holes being located proximate the peripheral edge regions of said substrate member and filled with of said dielectric material encapsulating the upper edge surface portions and lower edge surface portion of said substrate member so as to enhance the degree of bonding and mechanical interlocking between said dielectric material and said substrate member.

2. An electronic package as claimed in claim 1, wherein said encapsulating dielectric material is sealingly bonded to at least peripheral edge surfaces of said thermally conductive planar member and of said substrate member which extend perpendicular to the planar surfaces of each of said members.

3. An electronic package as claimed in claim 2, wherein said encapsulating dielectric material is sealingly bonded to said peripheral edge portions of said distal surface of said substrate member, and forms a thin covering having a thickness of between about 10 to 20 mils.

4. An electronic package as claimed in claim 3, wherein said distal surface of said substrate member intermediate the encapsulated edge portions thereof is devoid of said encapsulating dielectric material so as to facilitate the attachment of a ball grid array (BGA) to said surface in electrical communication with circuitry on said substrate.

5. An electronic package as claimed in claim 1, wherein said dielectric material comprises a molded adhesive compound.

6. An electronic package as claimed in claim 5, wherein said molded adhesive compound comprises a thermoset plastic.

7. An electronic package as claimed in claim 5, wherein said molded adhesive compound comprises an epoxy resin.

8. An electrical package as claimed in claim 1, wherein said encapsulating rigid dielectric material comprises a plastic composition which encompasses said package components through the application of transfer molding.

9. An electronic package as claimed in claim 1, wherein said thermally conductive member comprises a cap-shaped heat spreader.

10. An electronic package, comprising:
a substrate member having a plurality of electrical circuits arranged thereon;
a semiconductor chip mounted on said substrate member in electrical communication with at least some of the electrical circuits on said substrate member, said semiconductor chip having a first planar surface spaced from a facing surface of said substrate member;
a thermally conductive planar member having first and second opposite surfaces being arranged in thermally conductive communication with a second planar surface of said semiconductor chip distal from said substrate member;
a substantially rigid dielectric material encapsulating said electronic package by sealingly extending about at least perimetrical edge surfaces of said thermally conductive member, said semiconductor chip, said substrate member and peripheral edge portions of the surface on said substrate member distal from the surface facing and mounting said semiconductor chip; and scallop-like recesses being formed along the peripheral edges of said substrate member, said recesses being filled with said dielectric material encapsulating the opposite surface edge portions of said substrate member so as to enhance the degree of bonding and mechanical interlocking between said dielectric material and said substrate member.

11. An electronic package as claimed in claim 10, wherein said encapsulating dielectric material is sealingly bonded to at least peripheral edge surfaces of said thermally conductive planar member and of said substrate member which extend perpendicular to the planar surfaces of each of said members.

12. An electronic package as claimed in claim 11, wherein said encapsulating dielectric material is sealingly bonded to said peripheral edge portions of said distal surface of said substrate member, and forms a thin covering having a thickness of between about 10 to 20 mils.

13. An electronic package as claimed in claim 12, wherein said distal surface of said substrate member intermediate the encapsulated edge portions thereof is devoid of said encapsulating dielectric material so as to facilitate the attachment of a ball grid array (BGA) to said surface in electrical communication with circuitry on said substrate.

14. An electronic package as claimed in claim 10, wherein said dielectric material comprises a molded adhesive compound.

15. An electronic package as claimed in claim 14, wherein said molded adhesive compound comprises a thermoset plastic.

16. An electronic package as claimed in claim 14, wherein said molded adhesive compound comprises an epoxy resin.

17. An electrical package as claimed in claim 10, wherein said encapsulating rigid dielectric material comprises a plastic composition which encompasses said package components through the application of transfer molding.

18. An electronic package as claimed in claim 10, wherein said thermally conductive member comprises a cap-shaped heat spreader.

* * * * *